May 7, 1968 R. CARRE 3,382,446

RESONANT AMPLIFIER CIRCUIT

Filed March 12, 1965

3,382,446

RESONANT AMPLIFIER CIRCUIT

Roland Carre, Paris, France, assignor to CSF—Compagnie Generale de Telegraphie Sans Fil, a corporation of France Filed Mar. 12, 1965, Ser. No. 439,313
Claims priority, application France, Mar. 13, 1964, 967,261
4 Claims. (Cl. 330—31)

ABSTRACT OF THE DISCLOSURE

In order that the resonance frequency and the damping can be adjusted independently of each other, an active resonant circuit is provided, comprising two cascade coupled transistors associated with resistors and capacitors, to the exclusion of any inductance coil. The damping is adjusted by varying the value of a resistor inserted in the collector circuit of the first transistor, and the resonance frequency by varying the values of the resistors and capacitors intercoupling the two transistors.

The present invention relates to tuned amplifiers and especially to those operating at low frequencies.

More particularly it is an object of the invention to provide an active load circuit which will be hereinafter called "active resonant circuit" because of the analogy of its functions with that of a conventional resonant circuit as a tuned amplifier load circuit.

According to the invention there is provided an active, transistorized amplifier load circuit comprising two cascade coupled transistors associated with resistors and capacitors, to the exclusion of inductance coils, in such a manner that the resonance frequency of the circuit, i.e., its gain-frequency characteristic, and its damping can be adjusted independently of each other.

A feedback circuit is advantageously associated with the amplifier transistor with which the load circuit according to the invention is associated.

For a better understanding of the invention and to show how the same may be carried into effect, reference will be made to drawing accompanying the following description and in which.

Figure 1:
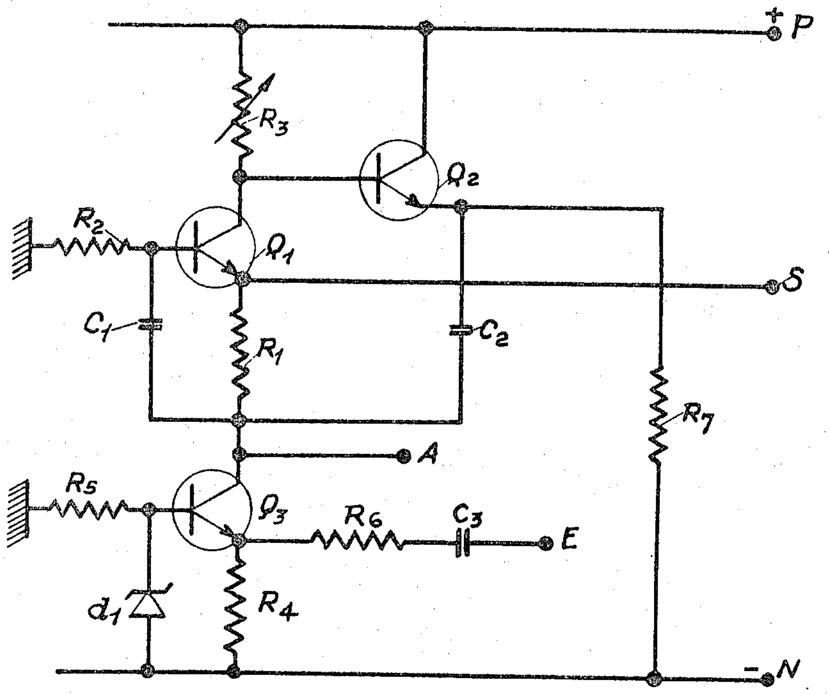
FIG. 1 shows a circuit arrangement according to the invention.

In FIG. 1 NPN transistors $Q_1$ and $Q_2$ and the associated components, resistors $R_1$, $R_2$, $R_3$ and capacitors $C_1$, $C_2$, form the actual resonant part of the circuit, i.e. the load circuit of transistor $Q_3$. Transistors $Q_1$ and $Q_2$ are connected in cascade, the base of transistor $Q_2$ being connected to the collector of transistor $Q_1$. Transistor $Q_1$ is connected to the collector of transistor $Q_3$, whose emitter receives the input signal.

The base of transistor $Q_3$ is grounded through a resistor $R_5$ and its emitter is connected to a point N of constant negative potential through a resistor $R_4$. The input signal is applied to a terminal E and passed to the emitter of transistor $Q_3$ through a capacitor $C_3$ and a resistor $R_6$ in series.

The current collected at the collector of transistor $Q_3$ feeds, through a resistor $R_1$, the emitter of transistor $Q_1$ whose base is grounded through resistor $R_2$ and whose collector is connected to a point P of constant positive potential through a resistor $R_3$. The collector of transistor $Q_1$ feeds the base of transistor $Q_2$, whose collector is also connected to terminal P and whose emitter is connected to terminal N through a resistor $R_7$. Capacitors $C_1$ and $C_2$ are connected between the collector of transistor $Q_3$ and respectively to the base of transistor $Q_1$ and to the emitter of transistor $Q_2$.

A Zener diode is inserted between the base of transistor $Q_3$ and terminal N.

The output signal can be collected either at S, i.e. at the emitter of transistor $Q_1$, or at A, i.e. at the collector of transistor $Q_3$, the signal collected at terminal A being of a higher level.

The respective gains of transistors $Q_1$ and $Q_2$ vary with the value of the components—resistors and capacitors—of their connecting circuits, and the term "resonance frequency of the arrangement" will designate, for a given set of components $R_1$, $R_2$, $R_3$ and $C_1$, $C_2$, the frequency making these gains a maximum.

Figure 2:
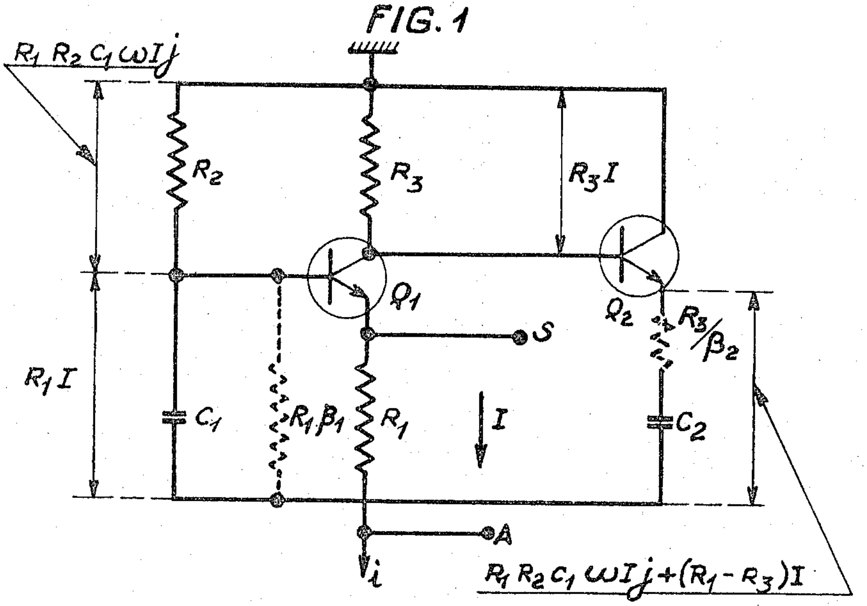
FIG. 2 shows an equivalent alternating current diagram.

The operation of the resonant circuit will be better understood by referring to the equivalent alternating current circuit shown in FIG. 2. In this diagram references A, S, $R_1$, $R_2$, $R_3$, $C_1$, $C_2$, $Q_1$ and $Q_2$ designate the same components as in FIG. 1.

For the purpose of simplification it will first be assumed that the transistors are perfect isolators; the effect in the circuit of the base current of these transistors will then be examined.

The operation will be set forth by calculating the applied current $i$ necessary to excite the resonant circuit supplying a current I of pulsation $\omega$ in transistor $Q_1$.

The voltage at the terminals of capacitor $C_1$ is very approximately equal to $R_1I$; the current $i_1$ through capacitor $C_1$ is then $i_1=R_1IC_1\omega j$ (where $j$ is such that $j^2=-1$).

In passing through $R_2$ this current generates at its terminals voltage $R_1R_2C_1\omega Ij$.

The total voltage at the circuit terminals is then:

$$R_1R_2C_1\omega Ij+R_1I$$

the voltage applied to capacitor $C_2$ is then approximately:

$$R_1R_2C_1\omega Ij+R_1I-R_3I$$

and the excitation current $i_2$ in capacitor $C_2$ will be:

$$C_2R_1I\omega j-C_2R_3I\omega j-R_1R_2C_1C_2\omega^2I$$

The excitation current, $i=i_1+I+i_2$, is equal to $$I[1+j\omega(R_1C_1+R_1C_2-C_2R_3)-R_1R_2C_1C_2]^2$$

It will thus be seen that the circuit resonates for a pulsation $\omega=1/\sqrt{R_1R_2C_1C_2}$ for which the real term is cancelled, and that damping can be adjusted by varying the value of resistance $R_3$, independently of the frequency, down to very low values.

The effect of the transistor base currents will now be considered.

By the assumption that the transistors are perfect isolators, two main errors have been introduced:

The first is due to variations of the base-emitter potential with the current.

This error is negligible if the components are properly selected to obtain a few volts at the terminals of resistance $R_1$ under rest conditions.

The second error due to base currents, can be simulated in FIG. 2 by adding in the circuits of this figure a stray resistor in parallel with capacitor $C_1$ and having a value $R_1\cdot\beta_1$ (where $\beta_1$ is the current gain of $Q_1$), and a resistor in series with capacitor $C_2$ and having a value $R_3/\beta_2$, where $\beta_2$ is the current gain of $Q_2$.

These two resistors are shown in dotted lines in FIG. 2.

They produce an additional damping term which can be compensated by adjustment of resistance $R_3$.

The invention thus provides small low-frequency resonant circuits. Among other things it can be used for designing band-pass filters, in particular for the construction of "speed" filters for Doppler radars in which conventional band-pass filters are often of prohibitive cost and size. When using the circuit as a band-pass filter it will be preferable ot use the signal of lower level collected at S, which provides zero voltage at very low frequencies.

Of course, the invention is not limited to the embodiment described and shown, which was given solely by way of example. In particular, one may as well use PNP transistors, subject to modifying the connections as known in the art.

What is claimed is:

1. An active resonant circuit comprising: a signal input; a first and a second transistor coupled in cascade, said transistors having respective emitters, bases and collectors, the collector of said first transistor being coupled to the base of said second transistor; a damping control resistor inserted in the collector circuit of said first transistor; and a resonance frequency control circuit comprising a second resistor, inserted in the base circuit of said first transistor, and a third resistor, a first and a second capacitor, inserted between said signal input and respectively the emitter and the base of said first transistor and the emitter of said second transistor.

2. An active resonant circuit having a first and a second terminal and comprising: a constant voltage input and a voltage reference point; a first and a second cascade coupled transistors, said first transistor having a first emitter coupled to said second terminal, a first collector and a first base, said second transistor having a second emitter, a second collector directly coupled to said voltage input and a second base coupled to said first collector; a damping control resistor inserted between said first collector and said voltage input; and a resonance frequency control circuit comprising a first resistor, a first and a second capacitor coupled between said first terminal and respectively said first emitter, said first base and said second emitter and a second resistor inserted between said first base and said voltage reference point.

3. A frequency selective amplifier comprising an amplifier having an output and an active resonant circuit comprising: a first and a second transistor coupled in cascade, said transistors having respective emitters, bases and collectors, the collector of said first transistor being coupled to the base of said second transistor; a damping control resistor inserted in the collector circuit of said first transistor; and a frequency control circuit comprising a second resistor inserted in the base circuit of said first transistor, and a third resistor, a first and a second capacitor inserted between said output and respectively the emitter and the base of said first transistor, and the emitter of said second transistor.

4. A frequency selective amplifier having an input, a high level output and a low level output and comprising: a first and a second constant direct voltage input and a voltage reference point; an amplifier comprising a common base mounted transistor having a first emitter, coupled to said input, a first base, a first collector connected to said high level output, and a current stabilisation circuit comprising a first resistor inserted between said first emitter and said second voltage input, a Zener diode inserted between said first base and said second voltage input and a second resistor inserted between said base and said voltage reference point; and an active resonant load circuit comprising a second and a third cascade coupled transistors, said second transistor having a second emitter coupled to said low level output, a second collector and a second base, said third transistor having a third emitter, a third collector directly coupled to said first voltage input and a third base coupled to said second collector, a damping control resistor inserted between said second collector and said first voltage input and a resonance frequency control circuit comprising a third resistor, a first and a second capacitor coupled between said high level output and respectively said second emitter, said second base and said third emitter, and a fourth resistor inserted between said second base and said voltage reference point.

No references cited.

JOHN KOMINSKI, *Acting Primary Examiner.*

ROY LAKE, *Examiner.*

E. C. FOLSOM, *Assistant Examiner.*